United States Patent [19]

Shelby

[11] Patent Number: 5,675,623

[45] Date of Patent: Oct. 7, 1997

[54] TWO DIMENSIONAL IMAGE PROCESSING HAVING LINEAR FILTER WITHIN A CCD ARRAY

[75] Inventor: Kevin A. Shelby, Scotch Plains, N.J.

[73] Assignee: Lucent Technologies Inc., Murray Hill, N.J.

[21] Appl. No.: 566,816

[22] Filed: Dec. 4, 1995

[51] Int. Cl.⁶ .................................................. G11C 19/28
[52] U.S. Cl. .................................. 377/54; 377/62; 377/63
[58] Field of Search ................................ 377/54, 62, 63

[56] References Cited

U.S. PATENT DOCUMENTS

| | | | |
|---|---|---|---|
| 4,990,985 | 2/1991 | Kamata | 377/63 |
| 5,153,731 | 10/1992 | Nagasaki et al. | 358/213.11 |
| 5,376,811 | 12/1994 | Ikeda | 377/62 |

Primary Examiner—Margaret R. Wambach

[57] ABSTRACT

Signal processing involves accruing signal charge at photosensors, accumulating samples of the content of several adjacent photosensors in individual potential wells of a CCD according to a predetermined pattern, shifting them into individual stages of a first group of registers, and shifting the contents of the first group of registers into a second register to create a linear filtering operation. Accumulating the samples averages the content of adjacent pixels.

18 Claims, 1 Drawing Sheet

TWO DIMENSIONAL IMAGE PROCESSING HAVING LINEAR FILTER WITHIN A CCD ARRAY

FIELD OF THE INVENTION

This invention relates to two dimensional image processing, and particularly image processing using a CCD array image sensor for purposes such as changing the image resolution of a CCD to video format.

BACKGROUND OF THE INVENTION

To adapt the output of a CCD to a particular video format it is often necessary to change its resolution. Such need would arise, for example, in a video telephone arrangement where the image resolution required for subsequent processing is less than that normally provided by a CCD.

Most image processing applications call for processing between lines (vertical processing) as well as processing within each line of the image (horizontal processing). Conventionally, a 2-D image processing system requires addition of hardware and intermediate line storage for vertically processing the horizontal result. Current interline transfer system CCDs used in imaging systems perform vertical processing with external line storage or explicit multiply/accumulate circuits.

SUMMARY OF THE INVENTION

An embodiment of the invention involves accruing signal charge at photosensors in a CCD, sampling contents of a plurality of photosensors at successive instances, shifting them into individual stages of the first group of registers, shifting the contents of said first group of registers into a second register, and, while sampling, accumulating samples of the content of a plurality of said photosensors in successive individual ones of said stages according to a predetermined pattern to create a linear filtering operation.

Shifting the first registers between sampling instances accumulates the charge from adjacent photosensors, thereby effectively summing their contributions at the stages of the first group of registers.

The various features of novelty which characterize the invention are pointed out with specificity in the claims forming a part of this specification. Objects and advantages of the invention will become evident from the following detailed description when read in light of the accompanying drawings.

DETAILED DESCRIPTION OF PREFERRED EMBODIMENTS

Figure 1:
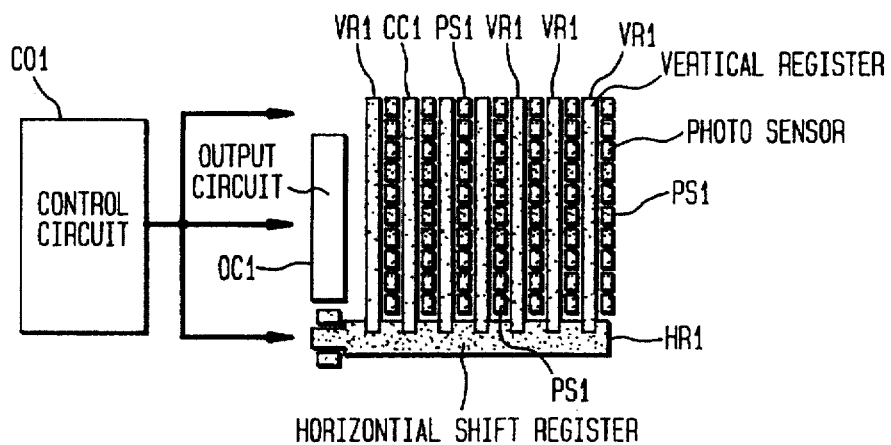
FIG. 1 is block diagram of an arrangement for image processing embodying features of the invention.

FIG. 1 illustrates a system using an interline transfer CCD. Here, a control circuit CO1 controls a CCD CC1 which captures light images. The control circuit CO1 causes vertically arranged photosensors PS1 in the CC1 to accumulate charge in response to light and transfer the charge to vertical shift registers VR1 after a prescribed integration period. The integration period determines the amount of charge accumulated. The vertical registers VR1 transfer the charges held therein, line by line to a horizontal shift register HR1. The latter then transfers its contents to an output circuit OC1.

In the past the operation of FIG. 1 involved charge integration by the photosensors PS1, transfer (or dumping) of the charge, i.e. the image content, to vertical shift registers VR1, vertically shifting the content of each row in the vertical shift registers VR1 to the horizontal shift register HR1 which shifts the content of the columns to the output circuit OC1 repeatedly for the total number N of columns, repeating the vertical and horizontal shifts for the total number M of rows, and then starting on the next frame.

Figure 2:
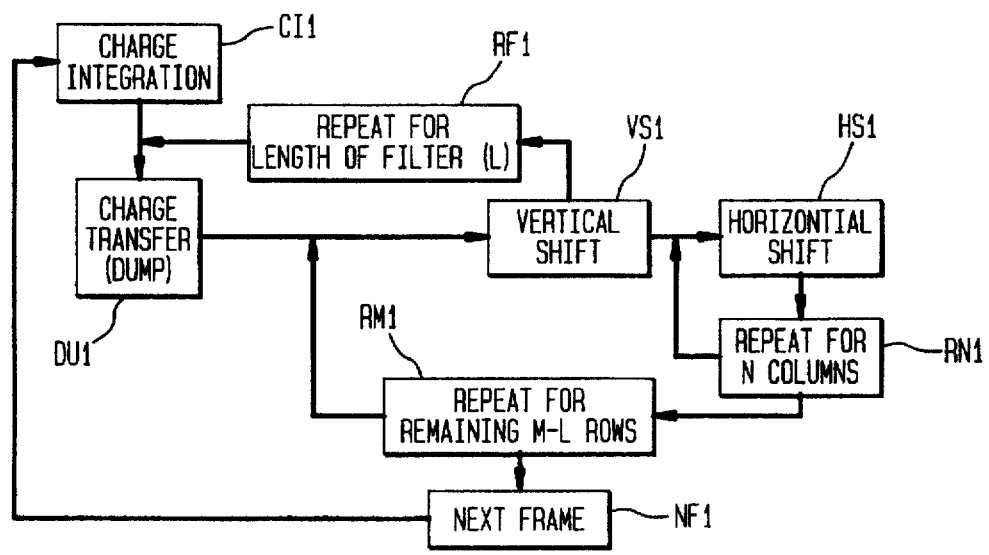
FIG. 2 is a flow chart illustrating the operation of the system in FIG. 1.

FIG. 2 illustrates the operation of the device in FIG. 1 according to an embodiment of the invention. Here charge integration is performed in step CI1. Charge transfer, or dumping, from each photosensor PS1 into a corresponding potential well of the vertical shift registers VR1 occurs in step DU1. The following step VS1 serves for vertically shifting the content of each row in the vertical shift registers VR1 to the horizontal shift register HR1. The latter, in step HR1, performs a horizontal shift and in step RN1 repeats the shifts to the output circuit OC1 repeatedly for the total number N of columns. The entire process is repeated for the remaining rows in step RM1 by returning to the step VS1. After the remaining rows the process, in step NF1, returns to start the next frame by passing to the charge integration step CI1. Thus with each charge transfer in step DU1 there occurs a vertical shift of the potential wells in the vertical shift registers VR1.

The embodiment of the invention further involves a step RF1, back to the charge transfer step DU1, after the vertical shift in step VS1. This causes another charge transfer, into the vertically shifted potential wells of the vertical register that had previously received charge, from the next adjacent photosensor. This repetition in step RF1 is done a number of times, such as three, representing the "length" L of a filter of this embodiment. This step further includes controlling the charge integration/accumulation at the photo-sensors PS1 and the transfer of charge through the CCD. The contributions from adjacent photosensors are combined by shifting the contents of the vertical registers between charge transfers. The extent to which each sampling instance contributes to the accumulated result is determined by the integration period preceding the charge transfer or dump. This accumulation and filtering operation constitutes a vertical filtering operation that may best be understood from consideration of the charge potential diagrams in FIG. 3.

Figure 3:
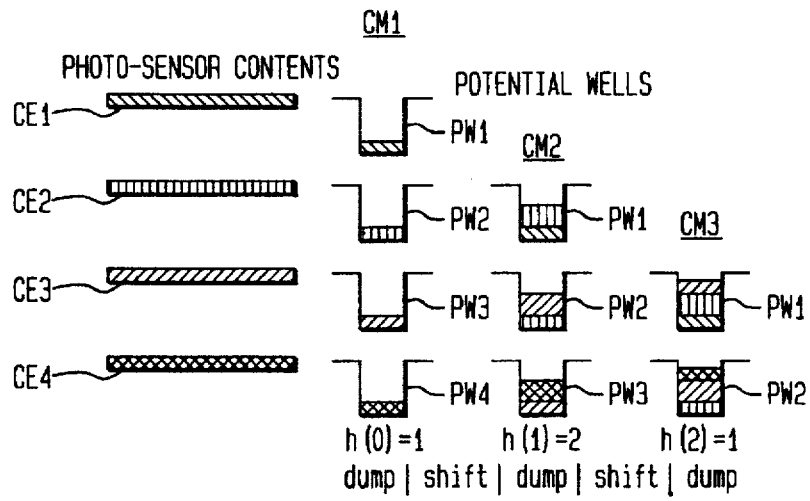
FIG. 3 shows a group of charge potential diagrams illustrating the effects the chart in FIG. 2.

In FIG. 3, photosensor PH1 contents CE1, CE2, CE3, and CE4 are placed in respective potential wells PW1, PW2, PW3, and PW4 (illustrated in FIG. 3 as being in a first column CM1) of a vertical shift register VR1. The potential wells are then shifted down to the positions shown in a second column CM2 of potential wells in FIG. 3. Charge transfer of the contents of CE2, CE3, and CE4 then is added into wells PW1, PW2, and PW3 from the adjacent photosensors PH1. After the next shift, (displayed in columsn CM3) contents CE3 and CE4 are added to the wells PW1 and PW2. The contents are thus placed into the potential wells on a dump-shift-dump-shift-dump basis. In the example shown the number of accumulations of charge transfer is three. Thus the operation performed by the step RF1 stops after the third repetition.

The integration period for the second charge transfer is selected to be twice as long as the integration period of the first and third. Hence the total second charge transfer is weighted by a factor of two relative to the first and third.

Alternating dumps from the photo-sensors with vertical shifts (i.e. dump/shift/dump) while varying the integration period for each sampling instance constitutes a linear filtering operation, i.e. y(n)=Σh(k)*x(n−k), where h(k) is a filtering coefficient, x is a pixel and (n−k) an index indicating a shift relative to a present sampling instance. Modulating the integration period in proportion with the filter coefficients, h(k), applies signal gain in each sampling instance equivalent to multiplying by a non-negative scalar. Shifting the vertical registers between sampling instances accumulates the charge from adjacent photo-sites, effectively summing their contributions at the potential wells weighted by the filter coefficients.

FIG. 3 depicts operation and filling of potential wells in three sampling instances in one of the vertical registers VR1 in an implementation of a 3-tap filter, h(k)={1, 2, 1}. In each sampling instance, the charge accumulated at the photo-sensors is added to that already held in the potential wells. The integration period in the second sampling instance is held twice as long as those in the first and last, weighing their contributions in proportion with the filter coefficients. After each sampling instance, the contents in the potential wells of the vertical registers are shifted to align the potential wells with the next line of photo-sensors. Once the contributions corresponding to each filter coefficient have been accumulated, the normal procedure for shifting the vertical registers a line at a time toward the output resumes. In effect this averages the output of adjacent channels. This averaging has the effect of a low pass filter.

According to an embodiment of the invention, signal variation is meant to occur vertically in space rather than between sampling instances in time. The image sensors are sampled more rapidly than the scene contents are varying. Thus, the charge accumulated in one sampling instance will closely approximate that accumulated in the previous sampling instance, excepting for scale. Sampled in this manner, each row of photo-sensors constitutes a line delay preserving the shift invariance implied by the linear filtering arrangement.

Normal CCD operation resumes after the first L (in the example of FIG. 3, three) lines. At that point each shift to the horizontal register comprises the contributions from L adjacent lines as determined by the filter coefficients. The signal shifted toward the output circuit is the result of the vertical process implemented in real-time during the first few lines of charge transfer without the need for additional line storage or circuitry.

The control circuit CO1 performs its functions by issuing the following signals to control the transfer of charge from the photo-sensors, through the vertical and horizontal shift registers, and ultimately to the CCD output:

SUB—Clears the photo-sensors of any accumulated charge

SG1, SG2—Dump the contents of the photosensor array in parallel to the vertical shift registers.

V01, . . . , V04—Transfer the contents of the vertical shift registers a line at a time toward the horizontal register.

H01, H02—Transfer the contents of the horizontal shift register toward the output.

The aforementioned signal nomenclature appears and sample signals appear in the book entitled "SONY® Semiconductor Integrated Circuit Handbook 1993" pages 148, 149, 162, and 163.

The occurrence of SUB relative to the next occurrence of SG1,2 determines the integration period for a given sampling instance. SUB clears the photo-sensors which are, otherwise, continuously accumulating charge. SG1,2 transfer any subsequent charge accumulation, in the odd and even rows, respectively, to the vertical registers. Appropriate modulation of V01, . . . , V04 shifts the contents of the vertical registers by one line in the direction of the horizontal register. Likewise, modulation of H01, H02 shifts the contents of the horizontal register toward the output.

To obtain signal conversion at the CCD output, signal charge is converted to signal voltage according to the following relationship:

$$V_{sig}=Q_{sig}/C$$

where C is the capacitance associated with the output circuit and $Q_{sig}$ is the signal charge. The amount of charge accumulated is determined by the light intensity incident on the photo-sensors and the time for which the sensors are allowed to accumulated, i.e. the integration period. Accordingly, signal gain can be affected by varying the integration time between sampling instances under slowly varying lighting conditions.

For the vertical image processing each vertical register includes an array of potential wells for receiving the charge accumulated at the photo-sensors. By taking advantage of their charge transfer capabilities, each vertical register then emulates a delay line as found in a linear filtering arrangement. In addition, a set of filter coefficients are implemented by controlling the signal gain for successive sampling instances.

A linear filtering operation can be described, as follows, as the convolution of an array of signal samples with an array of filter coefficients:

$$y(n)=\Sigma h(k)*x(n-k),$$

where the index (n−k) indicates a shift relative to the Present sampling instance. Each output sample is computed as the weighted sum of contributions from the surrounding input samples where the weights are determined by the coefficient values.

The filtering operation described above is implemented in the vertical registers by controlling the charge integration at the photo-sensors and the transfer of charge through the CCD. The contributions from adjacent photo-sites can be combined by shifting the contents of the vertical registers between charge transfers. The extent to which each sensor contributes to the accumulated result is determined by the integration period preceding the charge transfer or dump.

The embodiments described provide efficient means for achieving a class of 2-D image filtering operations within an existing CCD architecture. They operate in the charge domain and thus take advantage of the CCD's charge transfer capabilities and eliminate the need for intermediate line storage and explicit multiply/accumulate circuits. Furthermore, because the coefficient gains are applied throughout the image in parallel, they reduce the latency through the vertical process and improve the overall system throughput.

According to an embodiment of the invention, the first N-1 lines of the CCD array (where N is the filter length) are discarded and/or ignored to preserve linearity in the CCD output.

The embodiments disclosed use charge domain procedures for effecting vertical image processing within a CCD's internal shift registers through manipulation of its control signals.

The embodiments disclosed incorporate charge accumulation at the photosensors into the process as an arithmetic tool using CCD's as delay lines. It may be regarded as using CCD's as delay lines in producing a signal process. Using the CCD's internal shift registers for accumulating the results of the vertical process eliminates the need for intermediate storage, thereby greatly reducing the expense of processing between lines of an image.

The embodiments disclosed may replace dedicated hardware in video coding systems for picture size conversion and for image zooming in a digital camera system.

The manner of effecting shifts appears in "C Language Algorithms for Digital Signal Processing" by Paul M. Embree and Bruce Kimble, published by Prentice Hall, Englewood Cliffs, N.J. 1991.

While embodiments of the invention have been described in detail, it will be obvious to those skilled in the art that the invention may be embodied otherwise without departing from its spirit and scope.

What is claimed is:

1. An image processing method, comprising:

a step of sampling contents of a plurality of photosensors in a CCD array at successive instances by individual stages of a first group of registers in the CCD array;

a step of shifting the contents of said first group of registers into a second register within the CCD array;

establishing a linear filtering operation within the CCD array by adding samples of the contents of a plurality of said photosensors in different individual ones of said stages of one register within the CCD array to the samples of the contents in the stages in other registers of the first group within the CCD array on a predetermined basis.

2. An image processing method as in claim 1, wherein the first group of registers are vertical registers within the CCD array and the second register is a horizontal register within the CCD array.

3. An image processing method as in claim 1, wherein the adding on the predetermined basis includes integration over time of each sampling of content of said photosensors in one register of the first group into successive ones of said stages in another register of the first group within the CCD array, and varying the integration time.

4. An image processing method as in claim 1, wherein the filtering operation has a predetermined length L defining a number of samples of the contents of individual photosensors shifted within the CCD array into the same stage of a register in the first group within the CCD array.

5. An image processing method as in claim 1, wherein the filtering operation within the CCD array is defined by $y(n)=\Sigma h(k)*x(n-k)$, wherein $h(k)$ is a filtering coefficient, $x$ is a pixel, and $(n-k)$ an index indicating a shift relative to a present sampling instance.

6. An image processing method as in claim 1, wherein the step of sampling includes determining the contents of the stages of the registers in the first group within the CCD array during a sampling on the basis of integration times, and varying the integration times according to a predetermined pattern.

7. An image processing method as in claim 1, wherein step of adding the contents of the different individual ones of said stages includes adding the contents to successive stages in other registers of the first group within the CCD array.

8. An image processing method as in claim 1, wherein the step of sampling the contents of the photosensors by individual stages of a first group of registers includes charge dumping from each of the photosensors into a corresponding potential well in a stage of vertical shift registers in the first group of registers, and the step of shifting the contents of the first group of registers into a second register includes vertically shifting the contents of each row of the vertical shift registers to a horizontal shift register.

9. An image processing method as in claim 8, further comprising horizontally shifting the contents in the horizontal shift register repeatedly for each of the registers of the first group.

10. An image processing method, as in claim 9, wherein the vertically shifting, and horizontally shifting, is repeated for rows in the registers of the first group in the CCD array.

11. An image processing method as in claim 10, further comprising again sampling contents of the plurality of photosensors within the CCD when the vertical shifting and horizontal shifting as been repeated for all rows.

12. An image processing method as in claim 10, wherein the adding includes charge dumping into the vertically shifted potential wells of the vertical registers of the first group in the CCD that had previously been charged from an adjacent photosensor in another row.

13. An image processing method as in claim 12, wherein the adding is accomplished a predetermined number of times representing a length L of a filter.

14. An image processing method as in claim 13, wherein contributions from adjacent photosensors are combined by adding the contents of vertical registers by charge dumping within the CCD array.

15. An image processing method as in claim 14, wherein the step of sampling by individual stages of the first group of registers includes placing contents of photosensors in respective potential wells of stages of said shift registers and then shifting the potential wells of one shift register to the potential wells of another shift register and adding the results of the shift and dumping into each of the registers.

16. An image processing method as in claim 15, wherein the contents are placed into potential wells of adjacent shift registers of the CCD array on a dump-shift-dump-shift-dump basis.

17. An image processing method as in claim 16, wherein an integration period for the second charge dump into an adjacent register is twice as long as the integration period for the previous and successive dumps so as to weight the second charge dump by a factor of two relative to the first and third.

18. An image processing method as in claim 17, wherein in the step of adding the contents includes shifting the contents of the potential wells of the vertical registers within the CCD array to align the potential wells with a next row of photosensors so as to average the output.

* * * * *